(12) United States Patent
Seong

(10) Patent No.: US 8,350,374 B2
(45) Date of Patent: Jan. 8, 2013

(54) MULTI-CHIP PACKAGE INCLUDING CHIP ADDRESS CIRCUIT

(75) Inventor: Jin Yong Seong, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 43 days.

(21) Appl. No.: 13/151,724

(22) Filed: Jun. 2, 2011

(65) Prior Publication Data

US 2012/0007248 A1 Jan. 12, 2012

(30) Foreign Application Priority Data

Jul. 9, 2010 (KR) ........................ 10-2010-0066494

(51) Int. Cl.
*H01L 23/02* (2006.01)
*H01L 23/52* (2006.01)
*H01L 23/34* (2006.01)

(52) U.S. Cl. .................... 257/686; 257/691; 257/723

(58) Field of Classification Search ............... 257/686, 257/691, 723
See application file for complete search history.

(56) References Cited

U.S. PATENT DOCUMENTS

| | | | | |
|---|---|---|---|---|
| 5,103,166 A * | 4/1992 | Jeon et al. | .............. | 324/750.15 |
| 5,983,331 A * | 11/1999 | Akamatsu et al. | ............ | 711/170 |
| 7,282,377 B2 * | 10/2007 | Muranaka | ...................... | 438/18 |
| 8,124,429 B2 * | 2/2012 | Norman | ......................... | 438/17 |
| 2004/0053429 A1 * | 3/2004 | Muranaka | ...................... | 438/17 |
| 2005/0046002 A1 * | 3/2005 | Lee et al. | ...................... | 257/678 |
| 2008/0309372 A1 * | 12/2008 | Monden et al. | .................. | 326/82 |

FOREIGN PATENT DOCUMENTS

| | | |
|---|---|---|
| KR | 1020020008610 | 1/2002 |
| KR | 1020090103774 | 10/2009 |
| KR | 1020110001084 | 1/2011 |

OTHER PUBLICATIONS

Notice of Allowance issued from the Korean Intellectual Property Office on May 29, 2012.

* cited by examiner

*Primary Examiner* — Luan C Thai
(74) *Attorney, Agent, or Firm* — IP & T Group LLP

(57) ABSTRACT

A multi-chip package according to an aspect of this disclosure includes a plurality of multi-chips. Each of the multi-chips includes a lead configured to receive an external power supply voltage, and a pad circuit configured to reset an internal node to the level of a ground voltage and to generate chip address information by controlling the potential of the internal node based on the state of a connection between the pad circuit and the lead.

16 Claims, 4 Drawing Sheets

MULTI-CHIP PACKAGE INCLUDING CHIP ADDRESS CIRCUIT

CROSS-REFERENCE TO RELATED APPLICATION

Priority to Korean patent application number 10-2010-0066494 filed on Jul. 9, 2010, the entire disclosure of which is incorporated by reference herein, is claimed.

BACKGROUND

Exemplary embodiments relate to a multi-chip package and, more particularly, to a multi-chip package including a chip address circuit, in which addresses can be assigned to a plurality of multi-chips using a lead to which an external power supply voltage is supplied.

With the development of the semiconductor industry and user needs, the size and weight of electronic devices have been reduced. Techniques such as a multi-chip package technique are used to achieve size and weight reduction. The multi-chip package technique is a technique in which a plurality of semiconductor chips is packaged as a single package. A multi-chip package employing the technique is advantageous in terms of a reduction in size and weight and of the mounting area, as compared with several packages each including a semiconductor chip.

In the package on which a plurality of chips is mounted as described above, different chip addresses are assigned to the respective chips and a chip selected by an external address is operated. For example, in a package including four chips, an address '00' may be assigned to the first chip, an address '01' may be assigned to the second chip, an address '10' may be assigned to the third chip, and an address '11' may be assigned to the fourth chip. Each of the first to fourth chips is selected according to an input address.

As a method of assigning an address to each chip, there is a method of assigning an address to a pad corresponding to address information by supplying a power supply voltage $V_{DD}$ and a ground voltage $V_{SS}$ upon packaging.

FIG. 1 shows the configuration of a conventional multi-chip package.

Referring to FIG. 1, the multi-chip package includes a first package chip 10 and a second package chip 20. The first package chip 10 includes leads 11A and 11B respectively coupled to an external power supply voltage $V_{DD}$ and a ground voltage $V_{SS}$, a pad circuit 12 coupled to the leads 11A and 11B through a wire, and an internal circuit 13 coupled to the pad circuit 12 and configured to receive chip address information from the pad circuit 12. The second package chip 20 has the same configuration as the first package chip 10 except the pad of a pad circuit 22 coupled to leads 21A and 21B through a wire. In other words, the first package chip 10 includes a first pad PAD_0 12A wire-bonded to the lead 11A and supplied with the power supply voltage $V_{DD}$, whereas the second package chip 20 includes a second pad PAD_1 22B wire-bonded to the lead 21B and supplied with the ground voltage $V_{SS}$. Therefore, they can have different pieces of chip address information.

In the conventional multi-chip package, each chip is to include first and second pads to which the power supply voltage $V_{DD}$ and the ground voltage $V_{SS}$ are respectively supplied in order to assign chip address information to the chip, and each chip is also to include the pads at a limited area. Furthermore, since the leads for supplying the power supply voltage $V_{DD}$ and the ground voltage $V_{SS}$ are closely disposed, there are limitations in coupling the leads with the pads, and addresses may not be assigned to a large number of multi-chips. Accordingly, the limited number of chips may be implemented in a multi-chip package.

BRIEF SUMMARY

Exemplary embodiments relate to a multi-chip package including pads in each chip, in which one of the pads is coupled to a lead to which an external power supply voltage is supplied and another of the pads is not coupled to the lead and maintains the level of a ground voltage. A chip address is generated based on the connection between the pads and the lead. Accordingly, there are no limitations on the arrangement of leads because a lead to which an external ground voltage is supplied is not used.

A multi-chip package according to an aspect of this disclosure includes a plurality of multi-chips. Each of the multi-chips includes a lead configured to receive an external power supply voltage, and a pad circuit configured to reset an internal node to a level of a ground voltage and to generate chip address information by controlling a potential of the internal node based on a state of a connection between the pad circuit and the lead.

A multi-chip package according to another aspect of this disclosure includes a plurality of multi-chips, each of which comprises a lead configured to receive an external power supply voltage, a pad circuit configured to output chip address information by controlling a potential of an internal node based on a state of a connection between the pad circuit and the lead, wherein the potential of the internal node is maintained in a level of a ground voltage if the pad circuit is not coupled to the lead, and a chip address circuit configured to comprise an internal circuit for receiving the chip address information and for using the received chip address information as a chip address.

DESCRIPTION OF EMBODIMENTS

Hereinafter, some exemplary embodiments of the present disclosure will be described in detail with reference to the accompanying drawings. The figures are provided to enable those of ordinary skill in the art to make and use the exemplary embodiments of the disclosure.

Figure 1:
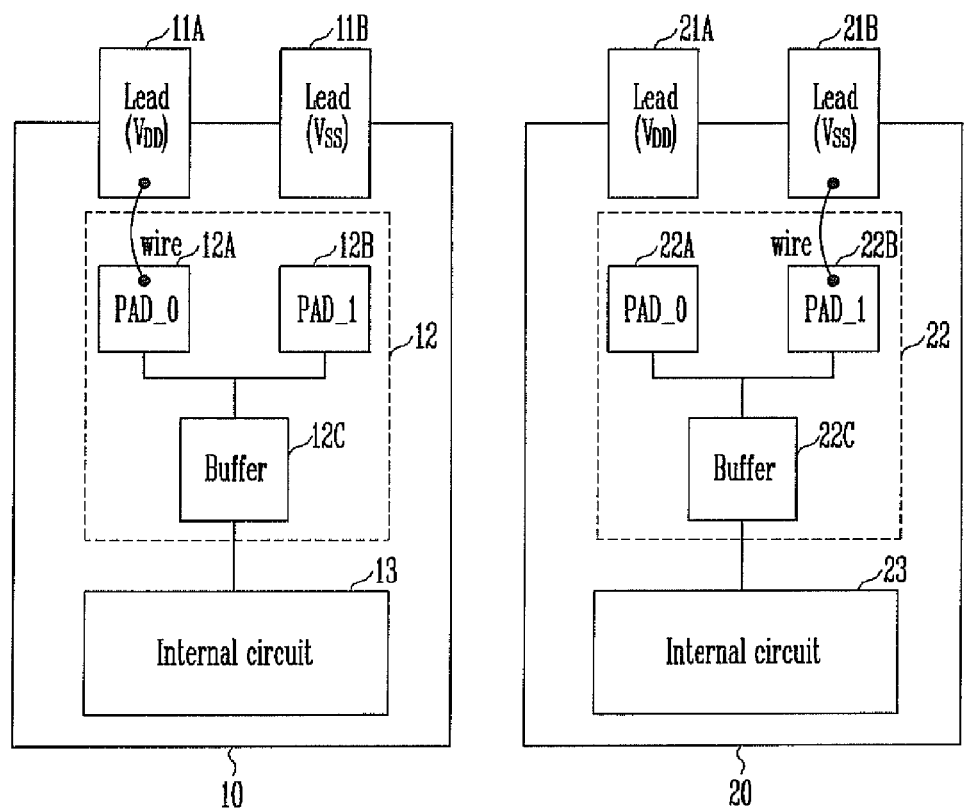
FIG. 1 shows the configuration of a conventional multi-chip package.
Figure 2:
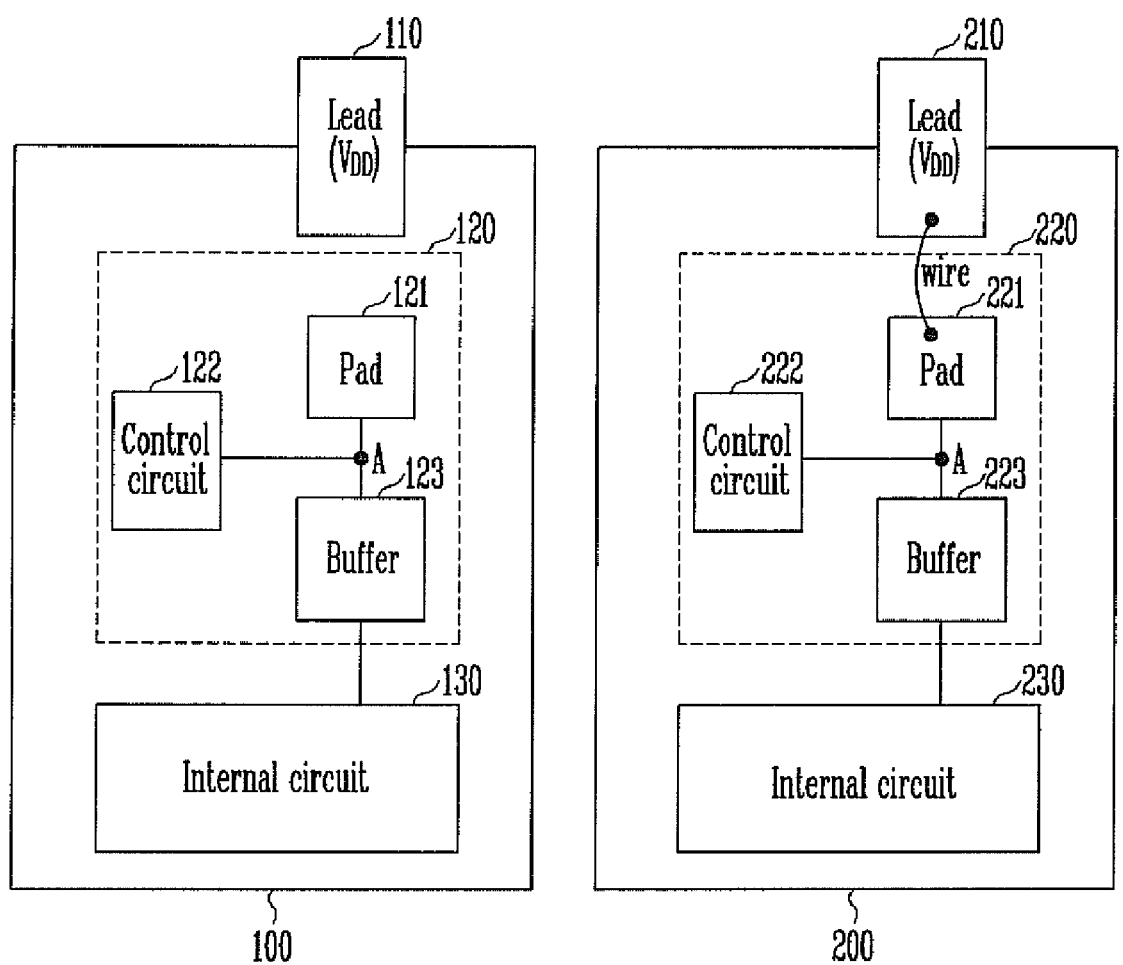
FIG. 2 shows the configuration of a multi-chip package according to a first exemplary embodiment of this disclosure.

FIG. 2 shows the configuration of a multi-chip package according to a first exemplary embodiment of this disclosure. The multi-chip package according to the first embodiment of this disclosure includes two chips as an example.

Referring to FIG. 2, the multi-chip package includes a first package chip 100 and a second package chip 200.

The first package chip 100 includes a pad circuit 120 and an internal circuit 130.

The pad circuit 120 is not coupled to a lead 110 to which an external power supply voltage $V_{DD}$ is supplied. The pad circuit 120 includes a pad 121, a control circuit 122, and a buffer 123.

The pad 121 is coupled to the buffer 123 via a node A. The control circuit 122 is coupled to the node A and configured to set an initial potential of the node A to a ground voltage GND. The buffer 123 receives the potential of the node A and outputs it to the internal circuit 130 as chip address information.

The pad 121 has no effect on the potential of the node A because it is not coupled to the lead 110. The control circuit 122 sets an initial potential of the node A to the level of the ground voltage GND. The buffer 123 receives the level of the ground voltage GND of the node A in the form of an input signal and sends the input signal to the internal circuit 130. In other words, an address '0' corresponding to the level of the ground voltage GND is assigned to the first package chip 100.

The second package chip 200 includes a pad circuit 220 and an internal circuit 230.

The pad circuit 220 is coupled to the lead 210 to which the external power supply voltage $V_{DD}$ is supplied through a wire and is configured to receive the external power supply voltage $V_{DD}$. The pad circuit 220 includes a pad 221, a control circuit 222, and a buffer 223. The lead 210 may be the same kind as the lead 110 of the first package chip 100. That is, when the first package chip 100 and the second package chip 200 are stacked together, they can share the same one lead (110, 210).

The pad 221 is coupled to the buffer 223 via a node A. The control circuit 222 is coupled to the node A and is configured to set an initial potential of the node A to the ground voltage GND. The buffer 223 receives the potential of the node A and outputs the potential to the internal circuit 230 as chip address information.

The control circuit 222 sets an initial potential of the node A to the ground voltage GND. Since the pad 221 is coupled to the lead 210 through the wire, the potential of the node A becomes the potential of the power supply voltage $V_{DD}$. The buffer 223 receives the potential of the power supply voltage $V_{DD}$ of the node A in the form of an input signal and sends the input signal to the internal circuit 230. That is, an address '1' corresponding to the potential of the power supply voltage $V_{DD}$ is assigned to the second package chip 200.

Figure 3A:
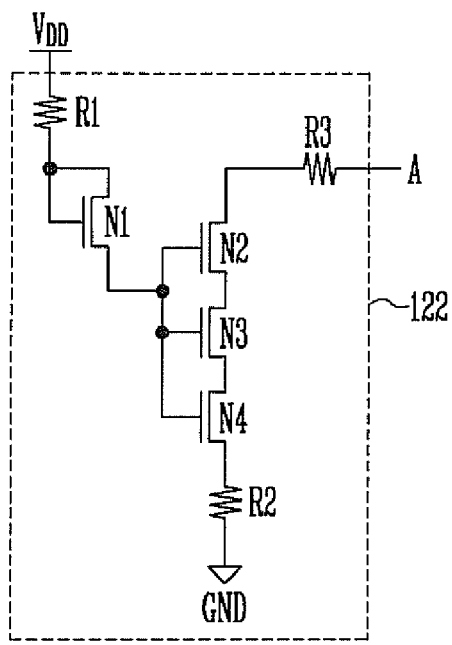
FIGS. 3A and 3B are circuit diagrams of a control circuit shown in FIG. 2.

FIG. 3A is a circuit diagram of the control circuit 122 shown in FIG. 2.

Referring to FIG. 3A, the control circuit 122 includes a plurality of resistors R1 to R3 and a plurality of NMOS transistors N1 to N4.

The resistor R1 is coupled between a terminal for the power supply voltage $V_{DD}$ and the gate of the NMOS transistor N1 and is configured to supply the power supply voltage $V_{DD}$ to the gate of the NMOS transistor N1. The NMOS transistor N1 is turned on by the power supply voltage $V_{DD}$ received via the resistor R1 and is configured to transmit the power supply voltage $V_{DD}$. The resistor R3, the NMOS transistors N2 to N4, and the resistor R2 are coupled in series between the node A and a terminal for the ground voltage GND.

The power supply voltage $V_{DD}$ received via the NMOS transistor N1 is supplied to the gates of the NMOS transistors N2 to N4. The NMOS transistors N2 to N4 are turned on by the power supply voltage $V_{DD}$. Accordingly, the ground voltage GND is supplied to the node A, and an initial potential of the node A is set to the ground potential.

Figure 3B:
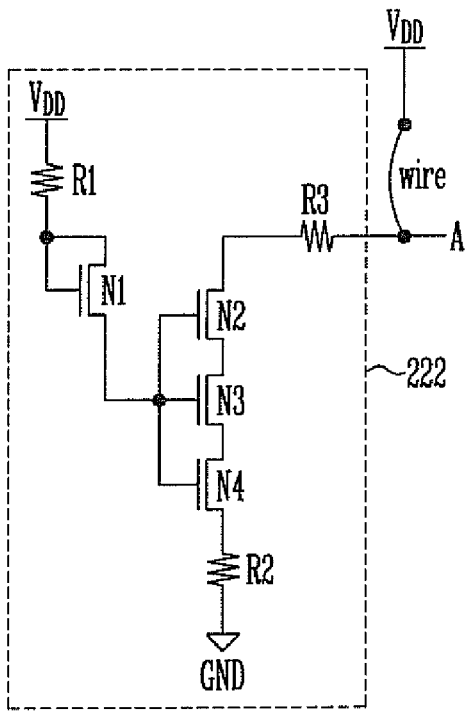

FIG. 3B is a circuit diagram of the control circuit 222 shown in FIG. 2.

Referring to FIG. 3B, the control circuit 222 includes a plurality of resistors R1 to R3 and a plurality of NMOS transistors N1 to N4.

The resistor R1 is coupled between the terminal of the power supply voltage $V_{DD}$ and the gate of the NMOS transistor N1, so that the power supply voltage $V_{DD}$ is supplied to the gate of the NMOS transistor N1. The NMOS transistor N1 is turned on by the power supply voltage $V_{DD}$ received via the resistor R1 and is configured to transmit the power supply voltage $V_{DD}$. The resistor R3, the NMOS transistors N2 to N4, and the resistor R2 are coupled in series between the node A and the terminal for the ground voltage GND. The power supply voltage $V_{DD}$ received via the NMOS transistor N1 is supplied to the gates of the NMOS transistors N2 to N4. The NMOS transistors N2 to N4 are turned on by the power supply voltage $V_{DD}$. Accordingly, the ground voltage GND is supplied to the node A. However, a potential of the node A of the control circuit 222 become the potential of the power supply voltage $V_{DD}$ because the power supply voltage $V_{DD}$ received via the pad 221 is supplied to the node A.

In the first embodiment of this disclosure, addresses '0' and '1' can be assigned to the first package chip 100 and the second package chip 200, respectively, using one lead (110 and 210). In other words, since a lead to which the ground voltage Vss is supplied is not used, it may reduce restrictions on the position of a pad in a package chip.

Figure 4:
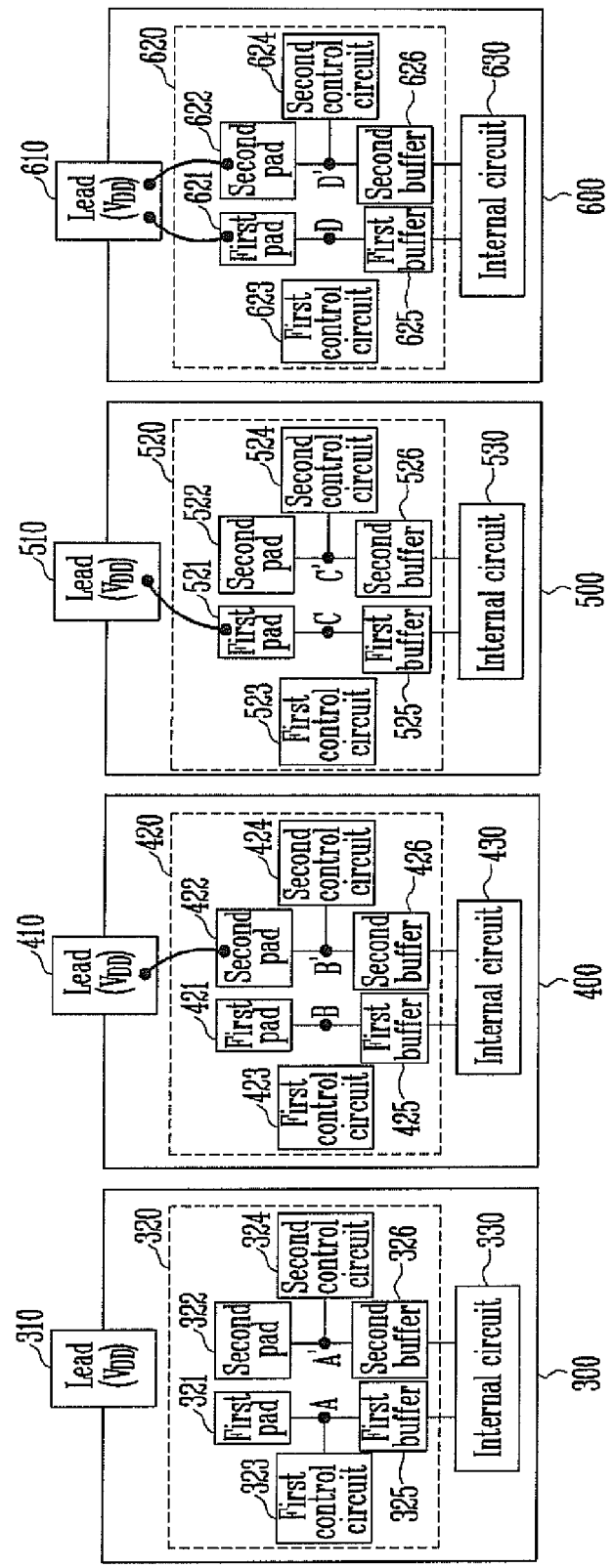
FIG. 4 shows the configuration of a multi-chip package according to a second exemplary embodiment of this disclosure.

FIG. 4 shows the configuration of a multi-chip package according to a second exemplary embodiment of this disclosure. The multi-chip package according to the second embodiment of this disclosure includes four chips as an example.

Referring to FIG. 4, the multi-chip package includes a first package chip 300 to a fourth package chip 600. The plurality of package chips have the same configuration except that a lead and a pad are coupled or not.

The first package chip 300 includes a pad circuit 320 and an internal circuit 330.

The pad circuit 320 includes a first pad 321, a second pad 322, a first control circuit 323, a second control circuit 324, a first buffer 325, and a second buffer 326. The first control circuit 323 and the second control circuit 324 have the same configuration and operation as the respective control circuits 122 and 222 of FIGS. 3A and 3B, and a detailed description thereof is omitted.

The first pad 321 is coupled to the first buffer 325 through a node A. The first control circuit 323 is coupled to the node A and is configured to set an initial potential of the node A to a ground voltage GND. The first buffer 325 receives the potential of the node A and sends it to the internal circuit 330. The second pad 322 is coupled to the second buffer 326 through a node A'. The second control circuit 324 is coupled to the node A' and is configured to set an initial potential of the node A' to the ground voltage GND. The second buffer 326 receives the potential of the node A' and sends it to the internal circuit 330.

The first pad 321 and the second pad 322 are not coupled to a lead 310 to which an external power supply voltage $V_{DD}$ is supplied.

The first pad 321 has no effect on the potential of the node A because it is not coupled to the lead 310. The first control circuit 323 sets an initial potential of the node A to the ground voltage GND. The first buffer 325 receives the potential of the node A in the form of an input signal and sends the input signal to the internal circuit 330. Furthermore, the second pad 322 has no effect on the potential of the node A' because it is not coupled to the lead 310. The second control circuit 324 sets an initial potential of the node A' to the ground voltage GND. The second buffer 326 receives the potential of the node A' in the form of an input signal and sends it to the internal circuit 330. Accordingly, an address '00', corresponding to the signals of first buffer 325 and the second buffer 326, is assigned to the first package chip 300.

The second package chip 400 is configured to have the same elements as the first package chip 300. In the second package chip 400, a second pad 422 is coupled to a lead 410 to which an external power supply voltage $V_{DD}$ is supplied through a wire, and a first pad 421 is not coupled to the lead 410.

The first pad 421 has no effect on the potential of the node B because it not coupled to the lead 410. A first control circuit 423 sets an initial potential of the node B to the ground voltage GND. A first buffer 425 receives the potential of the node B in the form of an input signal and sends the input signal to an internal circuit 430. A second control circuit 424 sets an initial potential of a node B' to the ground voltage GND. However, the node B' has the potential of the power supply voltage $V_{DD}$ because the second pad 422 is coupled to the lead 410. A second buffer 426 receives the potential of the node B' in the form of an input signal and sends the input signal to the internal circuit 430. An address '01', corresponding to the signals of the first buffer 425 and the second buffer 426, is assigned to the second package chip 400.

The third package chip 500 is configured to have the same elements as the first package chip 300. A first pad 521 is coupled to a lead 510 to which the external power supply voltage $V_{DD}$ is supplied through a wire, and a second pad 522 is not coupled to the lead 510.

A first control circuit 523 sets the initial potential of a node C to the ground voltage GND. However, the node C has the potential of the power supply voltage $V_{DD}$ because the first pad 521 is coupled to the lead 510. A first buffer 525 receives the potential of the node C in the form of an input signal and sends the input signal to an internal circuit 530. The second pad 522 has no effect on the potential of a node C' because it is not coupled to the lead 510. A second control circuit 524 sets an initial potential of the node C' to the ground voltage GND. A second buffer 526 receives the potential of the node C' in the form of an input signal and sends the input signal to the internal circuit 530. In other words, an address '10', corresponding to the signals of the first buffer 525 and the second buffer 526, is assigned to the third package chip 500.

A fourth package chip 600 is configured to have the same elements as the first package chip 300. A first pad 621 and a second pad 622 are coupled to a lead 610 to which the external power supply voltage $V_{DD}$ is supplied through a wire.

A first control circuit 623 sets the initial potential of a node D to the ground voltage GND. However, the node D has the potential of the power supply voltage $V_{DD}$ because the first pad 621 is coupled to the lead 610. A first buffer 625 receives the potential of the node D in the form of an input signal and sends the input signal to an internal circuit 630. A second control circuit 624 sets the initial potential of a node D' to the ground voltage GND. However, the node D' has the potential of the power supply voltage $V_{DD}$ because the second pad 622 is coupled to the lead 610. A second buffer 626 receives the potential of the node D' in the form of an input signal and sends the input signal to the internal circuit 630. In other words, an address '11', corresponding to the signals of the first buffer 625 and the second buffer 626, is assigned to the fourth package chip 600.

The leads 310, 410, 510, and 610 coupled to or separated from the first to fourth package chips 300 to 600, respectively, refer to the same one lead. That is, the first to fourth package chips 300 to 600 are sequentially stacked and configured to have the same one lead (310, 410, 510, and 610).

As described above, in the second embodiment of this disclosure, two pads are disposed in one package chip and a connection between the pads and a lead is controlled. Accordingly, different addresses can be assigned to four package chips. That is, addresses '00', '01', '10', and '11' may be assigned to the four package chips using one lead. Accordingly, since a lead to which the ground voltage is supplied is not used, the pad of the package chip can be freely disposed. Furthermore, in controlling a plurality of multi-chips, the number of pads is reduced and thus the degree of integration of devices is increased. Furthermore, the number of wire bonds for coupling the lead and the pad is reduced.

Table 1 illustrates a method of assigning different addresses to 16 chips each including four pads according to the state of a connection between the four pads and a lead to which an external power supply voltage $V_{DD}$ is supplied.

TABLE 1

| | CONNECTION WITH LEAD | | | | ADDRESS ASSIGNED TO | | | |
|---|---|---|---|---|---|---|---|---|
| | FIRST PAD | SECOND PAD | THIRD PAD | FOURTH PAD | INTERNAL CIRCUIT | | | |
| Chip1 | NC | NC | NC | NC | 0 | 0 | 0 | 0 |
| Chip2 | CT | NC | NC | NC | 1 | 0 | 0 | 0 |
| Chip3 | NC | CT | NC | NC | 0 | 1 | 0 | 0 |
| Chip4 | CT | CT | NC | NC | 1 | 1 | 0 | 0 |
| Chip5 | NC | NC | CT | NC | 0 | 0 | 1 | 0 |
| Chip6 | CT | NC | CT | NC | 1 | 0 | 1 | 0 |
| Chip7 | NC | CT | CT | NC | 0 | 1 | 1 | 0 |
| Chip8 | CT | CT | CT | NC | 1 | 1 | 1 | 0 |
| Chip9 | NC | NC | NC | CT | 0 | 0 | 0 | 1 |
| Chip10 | CT | NC | NC | CT | 1 | 0 | 0 | 1 |
| Chip11 | NC | CT | NC | CT | 0 | 1 | 0 | 1 |
| Chip12 | CT | CT | NC | CT | 1 | 1 | 0 | 1 |
| Chip13 | NC | NC | CT | CT | 0 | 0 | 1 | 1 |
| Chip14 | CT | NC | CT | CT | 1 | 0 | 1 | 1 |
| Chip15 | NC | CT | CT | CT | 0 | 1 | 1 | 1 |
| Chip16 | CT | CT | CT | CT | 1 | 1 | 1 | 1 |

Note: NC is an Abbreviation of Non-Contact, and CT is an Abbreviation of Contact Referring to Table 1, after the four pads are configured in one package chip, different addresses are assigned to 16 chips according to the state of a connection between the pads and the lead to which the external power supply voltage $V_{DD}$ is supplied.

Table 2 illustrates a method of dividing a chip enable signal CE, supplied to each chip, into a first chip enable signal CE#1 and a second chip enable signal CE#2 and assigning different addresses to 16 chips each including three pads.

TABLE 2

| | CONNECTION WITH LEAD | | | | ADDRESS ASSIGNED TO INTERNAL CIRCUIT | | |
|---|---|---|---|---|---|---|---|
| | FIRST PAD | SECOND PAD | THIRD PAD | CHIP ENABLE SIGNAL | | | |
| Chip1 | NC | NC | NC | CE # 1 | 0 | 0 | 0 |
| Chip2 | CT | NC | NC | CE # 1 | 1 | 0 | 0 |
| Chip3 | NC | CT | NC | CE # 1 | 0 | 1 | 0 |
| Chip4 | CT | CT | NC | CE # 1 | 1 | 1 | 0 |
| Chip5 | NC | NC | CT | CE # 1 | 0 | 0 | 1 |
| Chip6 | CT | NC | CT | CE # 1 | 1 | 0 | 1 |
| Chip7 | NC | CT | CT | CE # 1 | 0 | 1 | 1 |
| Chip8 | CT | CT | CT | CE # 1 | 1 | 1 | 1 |
| Chip9 | NC | NC | NC | CE # 2 | 0 | 0 | 0 |
| Chip10 | CT | NC | NC | CE # 2 | 1 | 0 | 0 |
| Chip11 | NC | CT | NC | CE # 2 | 0 | 1 | 0 |
| Chip12 | CT | CT | NC | CE # 2 | 1 | 1 | 0 |
| Chip13 | NC | NC | CT | CE # 2 | 0 | 0 | 1 |
| Chip14 | CT | NC | CT | CE # 2 | 1 | 0 | 1 |
| Chip15 | NC | CT | CT | CE # 2 | 0 | 1 | 1 |
| Chip16 | CT | CT | CT | CE # 2 | 1 | 1 | 1 |

Table 3 illustrates a method of dividing a chip enable signal CE, supplied to each chip, into a first chip enable signal CE#1 to a fourth chip enable signal CE#4 and assigning different addresses to 16 chips each including two pads.

TABLE 3

|  | CONNECTION WITH LEAD | | CHIP ENABLE SIGNAL | ADDRESS ASSIGNED TO INTERNAL CIRCUIT | |
| --- | --- | --- | --- | --- | --- |
|  | FIRST PAD | SECOND PAD | | | |
| Chip1 | NC | NC | CE # 1 | 0 | 0 |
| Chip2 | CT | NC | CE # 1 | 1 | 0 |
| Chip3 | NC | CT | CE # 1 | 1 | 0 |
| Chip4 | CT | CT | CE # 1 | 1 | 1 |
| Chip5 | NC | NC | CE # 2 | 0 | 0 |
| Chip6 | CT | NC | CE # 2 | 1 | 0 |
| Chip7 | NC | CT | CE # 2 | 1 | 0 |
| Chip8 | CT | CT | CE # 2 | 1 | 1 |
| Chip9 | NC | NC | CE # 3 | 0 | 0 |
| Chip10 | CT | NC | CE # 3 | 1 | 0 |
| Chip11 | NC | CT | CE # 3 | 1 | 0 |
| Chip12 | CT | CT | CE # 3 | 1 | 1 |
| Chip13 | NC | NC | CE # 4 | 0 | 0 |
| Chip14 | CT | NC | CE # 4 | 1 | 0 |
| Chip15 | NC | CT | CE # 4 | 1 | 0 |
| Chip16 | CT | CT | CE # 4 | 1 | 1 |

As in Tables 1 to 3, the number of package chips to which addresses can be assigned can be increased by increasing the number of pads within the chip. Furthermore, the number of chips to which addresses can be assigned can be increased by increasing the number of chip enable signals.

In accordance with the embodiments of this disclosure, the address circuit of the multi-chip package generates an address using a pad, coupled to a lead to which an external power supply voltage is supplied, and a pad not coupled to the lead for every package chip. The pad not coupled to the lead maintains the level of a ground voltage. Since the lead to which the ground voltage is supplied is not used, the pad of the chip can be freely disposed. Furthermore, in controlling a plurality of multi-chips, the number of pads can be reduced and thus the degree of integration of devices can be increased. In addition, the number of wire bonds for coupling the lead and the pad can be reduced.

What is claimed is:

1. A multi-chip package comprising a plurality of multi-chips, each of the multi-chips comprising:
    a lead configured to receive an external power supply voltage; and
    a pad circuit configured to reset an internal node to a level of a ground voltage and to generate chip address information by controlling a potential of the internal node based on a state of a connection between the pad circuit and the lead.

2. The multi-chip package of claim 1, further comprising a chip address circuit configured to receive the chip address information and use the received chip address information as a chip address.

3. The multi-chip package of claim 1, wherein the pad circuit comprises:
    a pad coupled to the internal node;
    a control circuit configured to reset the internal node to the level of the ground voltage; and
    a buffer coupled to the internal node and configured to output the potential of the internal node as the chip address information.

4. The multi-chip package of claim 3, wherein:
    if the pad is coupled to the lead, the internal node has a level of a power supply voltage, and
    if the pad is separated from the lead, the internal node has the level of the ground voltage.

5. The multi-chip package of claim 1, wherein the pad circuit comprises:
    a plurality of nodes as the internal node;
    a plurality of pads coupled to the nodes, respectively;
    a plurality of control circuits configured to reset the respective nodes to the level of the ground voltage; and
    a plurality of buffers coupled to the respective nodes and configured to output potentials of the nodes as pieces of the chip address information.

6. The multi-chip package of claim 3, wherein the control circuit comprises a plurality of resistors coupled between the internal node and a terminal for the ground voltage.

7. The multi-chip package of claim 5, wherein each of the control circuits comprises a plurality of resistors coupled between a terminal for the ground voltage and a corresponding one of the nodes.

8. The multi-chip package of claim 1, wherein the state of the connection between the pad circuit and the lead is differently set in each of the multi-chips.

9. The multi-chip package of claim 3, wherein:
    if the pad is coupled to the lead, the buffer outputs the chip address information of a logic level '1', and
    if the pad is not coupled to the lead, the buffer outputs the chip address information of a logic level '0'.

10. The multi-chip package of claim 1, wherein the pad circuit comprises:
    first and second internal nodes as the internal node;
    first and second pads coupled to the first and second internal node, respectively;
    first and second control circuits configured to reset the first and second internal nodes, respectively, to the level of the ground voltage; and
    first and second buffers coupled to the first and second internal nodes, respectively, and configured to output potentials of the first and second internal nodes as pieces of the chip address information.

11. The multi-chip package of claim 10, wherein a state of a connection between the first and second pads and the lead is differently set in each of the multi-chips.

12. The multi-chip package of claim 10, wherein:
    if the first and second pads are not coupled to the lead, the chip address information is '00',
    if the first pad is not coupled to the lead and the second pad is coupled to the lead, the chip address information is '01',
    if the first pad is coupled to the lead and the second pad is not coupled to the lead, the chip address information is '10', and
    if the first and second pads are coupled to the lead, the chip address information is '11'.

13. A multi-chip package comprising a plurality of multi-chips, each of the multi-chips comprising:
    a lead configured to receive an external power supply voltage;
    a pad circuit configured to output chip address information by controlling a potential of an internal node based on a state of a connection between the pad circuit and the lead, wherein the potential of the internal node is maintained at a level of a ground voltage if the pad circuit is not coupled to the lead; and a chip address circuit configured to comprise an internal circuit for receiving the chip address information and for using the received chip address information as a chip address.

14. The multi-chip package of claim 13, wherein the pad circuit comprises:
a pad coupled to the internal node;
a control circuit configured to reset the internal node to the level of the ground voltage; and
a buffer coupled to the internal node and configured to output the potential of the internal node as the chip address information.

15. The multi-chip package of claim 13, wherein the pad circuit comprises:
a plurality of nodes as the internal node;
a plurality of pads coupled to the nodes, respectively;
a plurality of control circuits configured to reset the respective nodes to the level of the ground voltage; and
a plurality of buffers coupled to the respective nodes and configured to output potentials of the nodes as pieces of the chip address information.

16. The multi-chip package of claim 13, wherein the pad circuit comprises:
first and second internal nodes as the internal node;
first and second pads coupled to the first and second internal node, respectively;
first and second control circuits configured to reset the first and second internal nodes, respectively, to the level of the ground voltage; and
first and second buffers coupled to the first and second internal nodes, respectively, and configured to output potentials of the first and second internal nodes as pieces of the chip address information.

* * * * *